United States Patent
Kim

[19]

[11] Patent Number: 5,929,669
[45] Date of Patent: Jul. 27, 1999

[54] OUTPUT BUFFER CIRCUIT FOR SEMICONDUCTOR MEMORY DEVICES

[75] Inventor: Jae-Hyeoung Kim, Seoul, Rep. of Korea

[73] Assignee: Hyundai Electronics Industries Co., Ltd., Kyoungki-do, Rep. of Korea

[21] Appl. No.: 08/998,910

[22] Filed: Dec. 29, 1997

[30] Foreign Application Priority Data

Dec. 30, 1996 [KR] Rep. of Korea .................... 96-77699

[51] Int. Cl.⁶ .............................................. H03K 19/0175
[52] U.S. Cl. ........................... 327/112; 327/379; 326/23; 326/27; 326/87
[58] Field of Search .................................. 326/23, 24, 25, 326/26, 27, 82, 83, 87; 327/379, 384, 388, 389, 108, 112

[56] References Cited

U.S. PATENT DOCUMENTS

| | | | |
|---|---|---|---|
| 4,959,816 | 9/1990 | Iwahashi et al. ................. | 365/233.5 |
| 5,173,621 | 12/1992 | Fraser et al. ................. | 326/78 |
| 5,231,311 | 7/1993 | Ferry et al. ................. | 326/27 |
| 5,475,646 | 12/1995 | Ogihara ................. | 365/222 |
| 5,576,640 | 11/1996 | Emnett et al. ................. | 326/83 |
| 5,739,707 | 4/1998 | Barraclough ................. | 326/27 |

*Primary Examiner*—Tuan T. Lam
*Attorney, Agent, or Firm*—Ware, Fressola, Van Der Sluys & Adolphson LLP

[57] ABSTRACT

Disclosed is an output signal buffer circuit of semiconductor memory devices comprises: a plurality of buffer groups each comprising a plurality of output buffers grouped into unit group, in which each output buffer comprises a pull up transistor and a pull down transistor connected between a power supply voltage and ground in series; driving means for sequentially driving respective buffer groups according to internal control signals; and control signal generating means for producing the internal control signals for sequentially driving said buffer groups to said driving means in accordance with an external control signal.

8 Claims, 6 Drawing Sheets

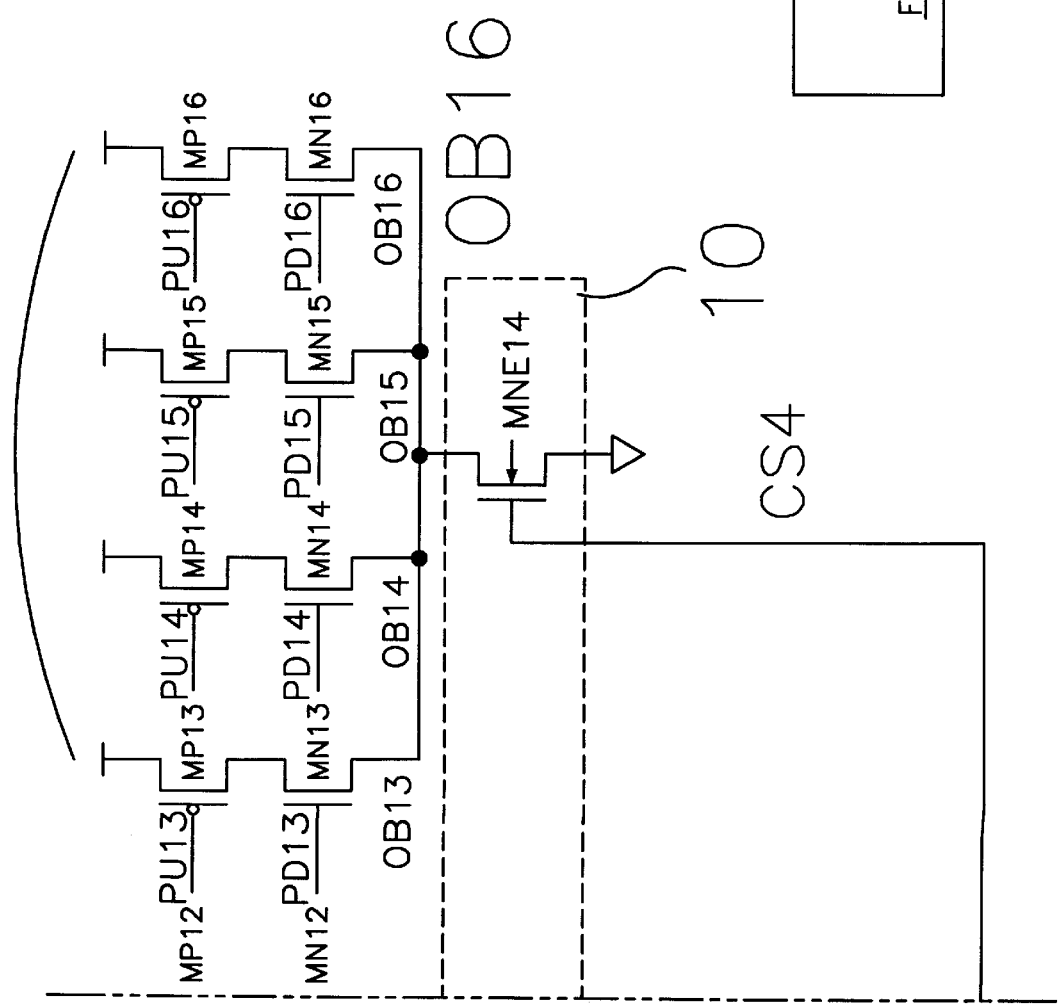

OE-CON

CS1

CS2

CS3

CS4

OUTPUT BUFFER CIRCUIT FOR SEMICONDUCTOR MEMORY DEVICES

BACKGROUND OF THE INVENTION

FIELD OF THE INVENTION

The present invention relates to an output buffer for semiconductor memory devices, and more specifically to an output buffer circuit for semiconductor memory devices capable of reducing ground noise by isolating ground and pull down transistors, and sequentially driving pull down transistors grounded.

In a conventional output buffer circuit for semiconductor memory devices, pull up and pull down transistors were made in large so as to obtain its large rise-fall output slope.

FIG. 1 is a conventional output buffer circuit for semiconductor memory devices comprised of a plurality of output buffers connected between a power supply voltage and ground in parallel.

In the conventional output buffer circuit for semiconductor memory devices of FIG. 1, x16 output buffers OB1~OB16 are connected between the power supply voltage Vcc and ground in parallel to each other. Each output buffer is comprised of a PMOS transistor for pull up MP1~MP16 for pull up and a NMOS transistor for pull down MN1~MN16, which are serially connected between a power supply voltage Vcc and ground GND. Pull up signals PU1~PU16 are respectively inputted into the respective gates of the PMOS transistors MP1~MP16 for pull up transistors, and pull down signals PD1~PD16 are respectively inputted into the respective gates of the NMOS transistors MN1~MN16 for pull down transistors, and the drains of the PMOS transistors MP1~MP16 and the NMOS transistors MN1~MN16 are commonly connected to generate respective output signals.

The output buffer circuit described above produces output signals by turning on the NMOS transistors MN1~MN16 with pull down input signals PD1~PD16 while the PMOS transistors MP1~MP16 are all turned off by pull up input signals PU1~PU16, or, by turning on the PMOS transistors MP1~MP16 with pull up signals PU1~PU16 while the NMOS transistors are all turned off by pull down input signals PD1~PD16.

When the pull down transistors, i.e., NMOS transistors MN1~MN16 are turned on by the pull down input signals PD1~PD16 simultaneously, a large ground noise is produced.

To solve the above problem, if the semiconductor substrate is a P type, a method for reducing a ground noise that isolates the transistors with the ground by metal lines has been suggested in the prior art. However, this method gives rise to ground noise via pick-up of the substrate, thus causing wrong operation of the output buffer circuit.

SUMMARY OF THE INVENTION

The object of the present invention is to provide an output buffer circuit for semiconductor memory devices capable of reducing ground noise by grouping output buffers into buffer groups, isolating the buffer groups with ground, and then sequentially driving the buffer groups.

To accomplish the object described above, the output buffer circuit for semiconductor memory devices according to the present invention comprises a plurality of buffer groups each comprising a plurality of output buffers arranged into unit group, in which each output buffer comprises a pull up transistor and a pull down transistor connected between a power supply voltage and ground in series; driving means for sequentially driving respective buffer groups according to internal control signals; and control signal generating means for producing the internal control signals which are for sequentially driving buffer groups to the driving means in accordance with an external control signal.

The driving means of the output buffer circuit for semiconductor memory devices according to the present invention comprises a plurality of means for sequentially driving the respective buffer groups in accordance with the internal control signals which are generated from the control signal generating means. Each means for driving buffer groups comprises a NMOS transistor where corresponding one of the internal control signals is inputted to its gate, corresponding one of the buffer group is connected to its drain, and the ground is connected to its source.

The control signal generating means of the output buffer circuit for semiconductor memory devices according to an embodiment of the present invention comprises a plurality of generating means for sequentially producing the internal control signals into the driving means according to the external control signal. Among the plurality of generating means for producing the internal control signals, first means for first generating the internal output signal comprises delay means including inverting gates for delaying the external control signal, and a NAND gate for receiving the delayed external control signal from the delay means and the external control signal, and producing the internal control signal to the driving means; and another generating means for generating the following internal control signal comprises delay means including inverting gates for receiving and delaying the internal control signal from the previous means, and producing the following internal control signal to driving means.

According to an embodiment of the present invention, a method for reducing ground noise in an output buffer circuit for semiconductor memory devices, which comprises a plurality of output buffers, said method comprising: grouping step for grouping a plurality of output buffers into buffer groups; driving step for sequentially driving the buffer groups.

The output buffer circuit of semiconductor memory devices according to the present invention can reduce ground noise to one fourth of that of the conventional output signal buffer circuit by arranging plural output buffers into buffer groups, isolating buffer groups from the ground, and sequentially driving buffer groups.

DETAILED DESCRIPTION OF THE INVENTION

Figure 1A:
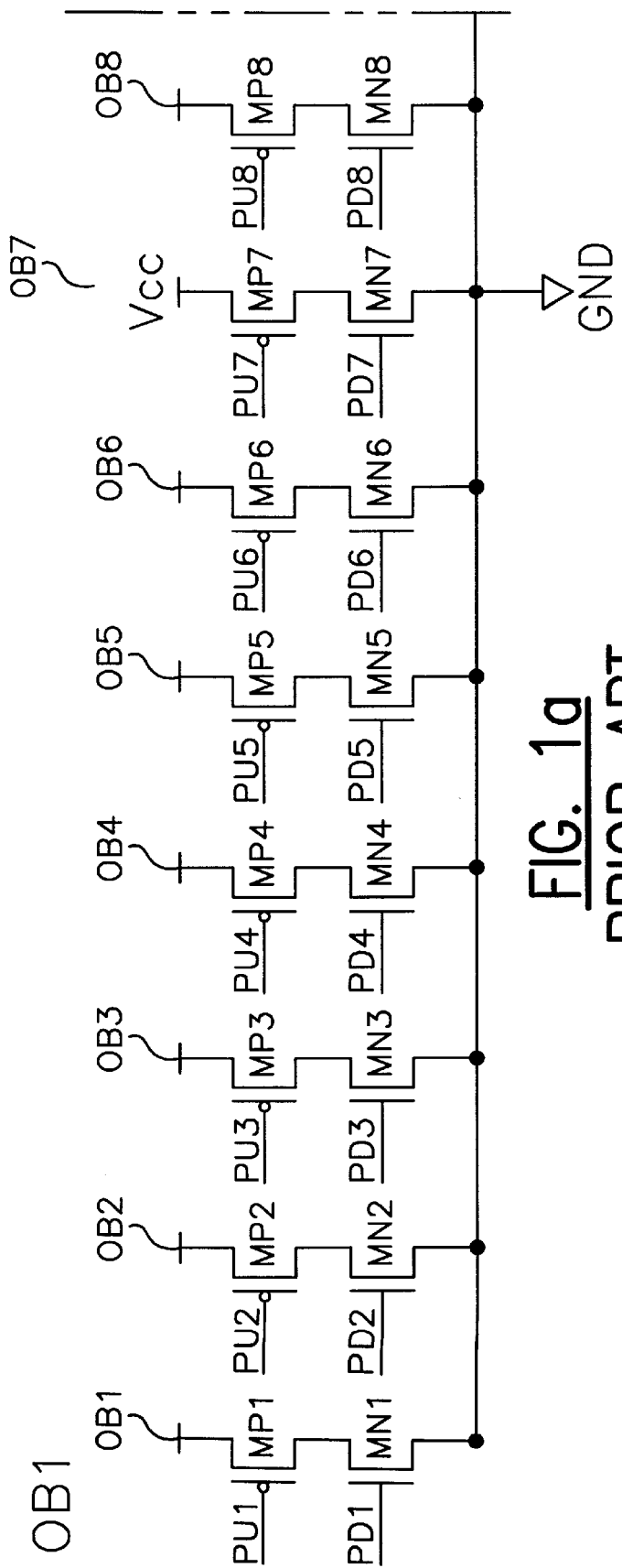
FIG. 1 is a conventional output buffer circuit diagram of semiconductor memory devices.

FIG. 2 is a circuit diagram of a semiconductor memory device according to the present invention. As shown in FIG. 2, the output buffer circuit of semiconductor memory devices according to the present invention comprises x16 output buffers OB1~OB16 connected between the power supply voltage Vcc and ground in parallel as similar in FIG. 1. Each of the output buffers OB1~OB16 comprises a PMOS transistor for pull up transistor MP1~MP16 where a pull up input signal PU1~PU16 is inputted to its gate and a NMOS transistor for a pull down transistor MN1~MN16 where a pull down signal PD1~PD16 is inputted to its gate, which are connected between a power supply voltage Vcc and ground GND in series.

In this embodiment of the present invention, the output buffer circuit groups x16 output buffers into four groups GR1~GR4, each containing four output buffers OB1~OB4, OB5~OB8, OB9~OB12, and OB13~OB16. Also, the output buffer circuit comprises a driving unit 10 for sequentially driving the buffer groups GR1~GR4, which is connected between the buffer groups and ground. The driving unit 10 comprises first through fourth driving means for sequentially driving respective buffer groups GR1~GR4 according to their respective control signal CS1~CS4. The first through fourth driving means of the driving unit 10 each comprises NMOS transistor MNE11~MNE14 where each control signal CS1~CS4 is inputted to its gates, each first through fourth buffer groups GR1~GR4 is connected to its drains, and the ground is connected to its source.

Also, the output buffer circuit comprises a control signal generating unit 20 for receiving an external output enable signal OE_CON, and sequentially producing first through fourth control signals CS1~CS4 to the gates of the first through fourth NMOS transistors MNE11~MNE14 of the driving unit 10.

The control signal generating unit 20 comprises first through fourth control signal generating means 21~24 for producing first through fourth control signals CS1~CS4 upon receiving the output enable signal OE_CON. The first control signal generating means 21 comprises delay means for delaying the output enable signal OE_CON and a NAND gate NA1 for receiving the output enable signal OE_CON and the delayed output enable signal OE_CON' from the delay means, and producing the first control signal CS1 to the gate of the first NMOS transistor MNE11 of the driving means 10. The delay means includes inverting gates IN1~IN3 for inverting and delaying the output enable signal OE_CON, and providing the delayed output enable signal OE_CON' to the NAND gate NA1 as an input signal.

The second control signal generating means 22 comprises inverting gates IN4~IN5 for delaying the first control signal CS1, and producing the second control signal CS2 to the gate of the second NMOS transistor MNE12 of the driving unit 10.

The third control signal generating means 23 comprises inverter gates IN6~IN7 for delaying the second control signal CS2, and producing the third control signal CS3 to the gate of the third NMOS transistor MNE13 of the driving unit 10.

The fourth control signal generating means 24 comprises inverting gates IN8~IN9 for delaying the third control signal CS3, and producing the fourth control signal CS4 to the gate of the fourth NMOS transistor MNE14 of the driving unit 10.

An operation of the output buffer circuit of semiconductor memory devices having a structure as described above is described below with reference to FIG. 3.

Figure 3A:
FIG. 3A through FIG. 3E are timing diagrams of the output buffer circuit shown in FIG. 2.

When the output enable signal OE_CON as in FIG. 3A is externally inputted to the output buffer circuit where 16 output buffers are grouped into four group GR1~GR4 by four output buffers, the output buffer circuit prepares to input the sensed data by sequentially driving the buffer groups GR1~GR4 in transition of the output enable signal OE_CON from low state to high state.

Figure 3B:

When the output enable signal OE_CON as shown in FIG. 3A transits from low state to high state, the first control signal generating means 21 of the control signal generating part 20 produces the first control signal CS1 as shown in FIG. 3B having a predetermined width through the inverting gates IN1~IN3 and the NAND gate NA1.

Figure 3C:
Figure 3D:
Figure 3E:

After the first control signal CS1 is generated, second through fourth control signals CS2~CS4 as shown in FIG. 3C through 3E are sequentially generated from second through fourth control signal generating means 22~24. Accordingly, the NMOS transistors MNE11~MNE14 are sequentially driven by the control signals CS1~CS4.

Thus, as shown in FIG. 3A through FIG. 3E, when the output enable signal OE_CON transits from low state to high state, the first bluffer group GR1 is driven by the first control signal CS1. Then, after delayed through the inverting gates IN4, IN5, the second buffer group GR2 is driven by the second control signal CS2. Similarity, after delayed through the inverting gates IN6, IN7, the third buffer group GR3 is driven by thethirdcontrolsignal CS3. Then, the fourth buffer group GR4 is finally driven by the fourth control signal CS4.

On the other hand, when the output enable signal OE_CON transits from high state to low state, the driving unit 10 is disabled because there are no control signals CS1~CS4 from the control signal generating part 20 to the driving part 10, so that the output buffer circuit is also disabled.

As described above, the output buffer circuit of semiconductor memory devices can reduce the ground noise down to one fourth of that of the prior art and accordingly prevent it from malfunctioning by grouping a plurality of output buffers into buffer groups by a predetermined number, and sequentially driving the buffer groups.

It will be apparent to those skilled in the art that various modifications and variations can be made in the output buffer circuit for the semiconductor memory devices of the present invention without departing from the spirit or scope of the invention. Thus, it is intended that the present invention cover the modifications and variations of this invention provided they come within the scope of the appended claims and their equivalents.

What is claimed is:

1. An output buffer circuit for semiconductor memory devices comprising:

a plurality of buffer groups each comprising a plurality of output buffers grouped into a unit group, in which each output buffer comprises a pull up transistor and a pull down transistor connected between a power supply voltage and ground in series;

driving means for sequentially driving respective buffer groups according to internal control signals; and control signal generating means for providing the internal control signals for sequentially driving said buffer groups by means of said driving means in accordance with an external control signal.

2. The output buffer circuit for semiconductor memory devices as claimed in claim 1, wherein said driving means comprises a plurality of means for sequentially driving their respective buffer groups in accordance with said internal control signals from said control signal generating means.

3. The output buffer circuit for semiconductor memory devices as claimed in claim 2, wherein said plurality of means for driving buffer groups each comprises a NMOS transistor where a corresponding one of said internal control signals is inputted to a gate of said NMOS transistor, a corresponding one of said buffer groups is connected to a drain of said NMOS transistor, and the ground is connected to a source of said NMOS transistor.

4. The output buffer circuit for semiconductor memory devices as claimed in claim 1, wherein said control signal generating means comprises a plurality of generating means for sequentially providing said internal control signals to said driving means according to said external control signal.

5. The output buffer circuit for semiconductor memory devices as claimed in claim 4, wherein a first generating means for generating a first internal control signal of said control signal generating means comprises:

delay means for delaying said external control signal; and a NAND gate for receiving said external control signal and said delayed external control signal by said delay means, and providing said internal first control signal.

6. The output buffer circuit for semiconductor memory devices as claimed in claim 5, wherein said delay means comprises inverting gates for inverting and delaying said external control signal.

7. The output buffer circuit for semiconductor memory devices as claimed in claim 4, wherein a first one of said plurality of generating means comprises a plurality of inverting gates for delaying the internal control signal.

8. A method for reducing ground noise in an output buffer circuit for semiconductor memory devices, wherein the output buffer circuit comprises a first plurality of output buffers and a second plurality of output buffers, and each of the output buffers in the first and second plurality includes a pull up transistor and a first pull down transistor, said method comprising:

forming a first connection which commonly connects each first pull down transistor of the first plurality of output buffers;

forming a second connection which commonly connects each first pull down transistor of the second plurality of output buffers;

connecting the first connection to a second pull down transistor;

connecting the second connection to a third pull down transistor; and driving the second and third pull down transistors sequentially.

\* \* \* \* \*

UNITED STATES PATENT AND TRADEMARK OFFICE
CERTIFICATE OF CORRECTION

PATENT NO : 5,929,669
DATED : July 27, 1999
INVENTOR(S): J. Kim

Figure 1:
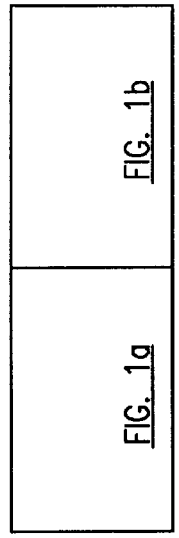
Figure 1B:
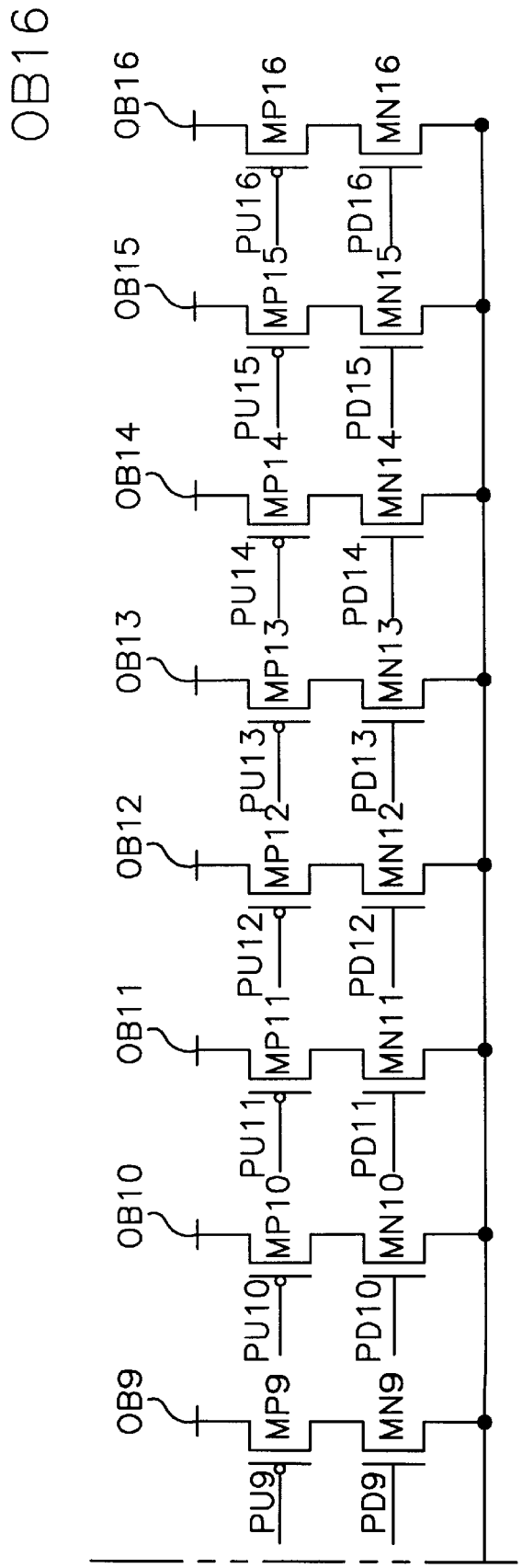

It is certified that error appears in the above-identified patent and that said Letters Patent is hereby corrected as shown below:

At col. 1, line 16, please cancel "FIG. 1" and substitute --Fig. 1a and 1b together show-- therefor.

Figure 2A:
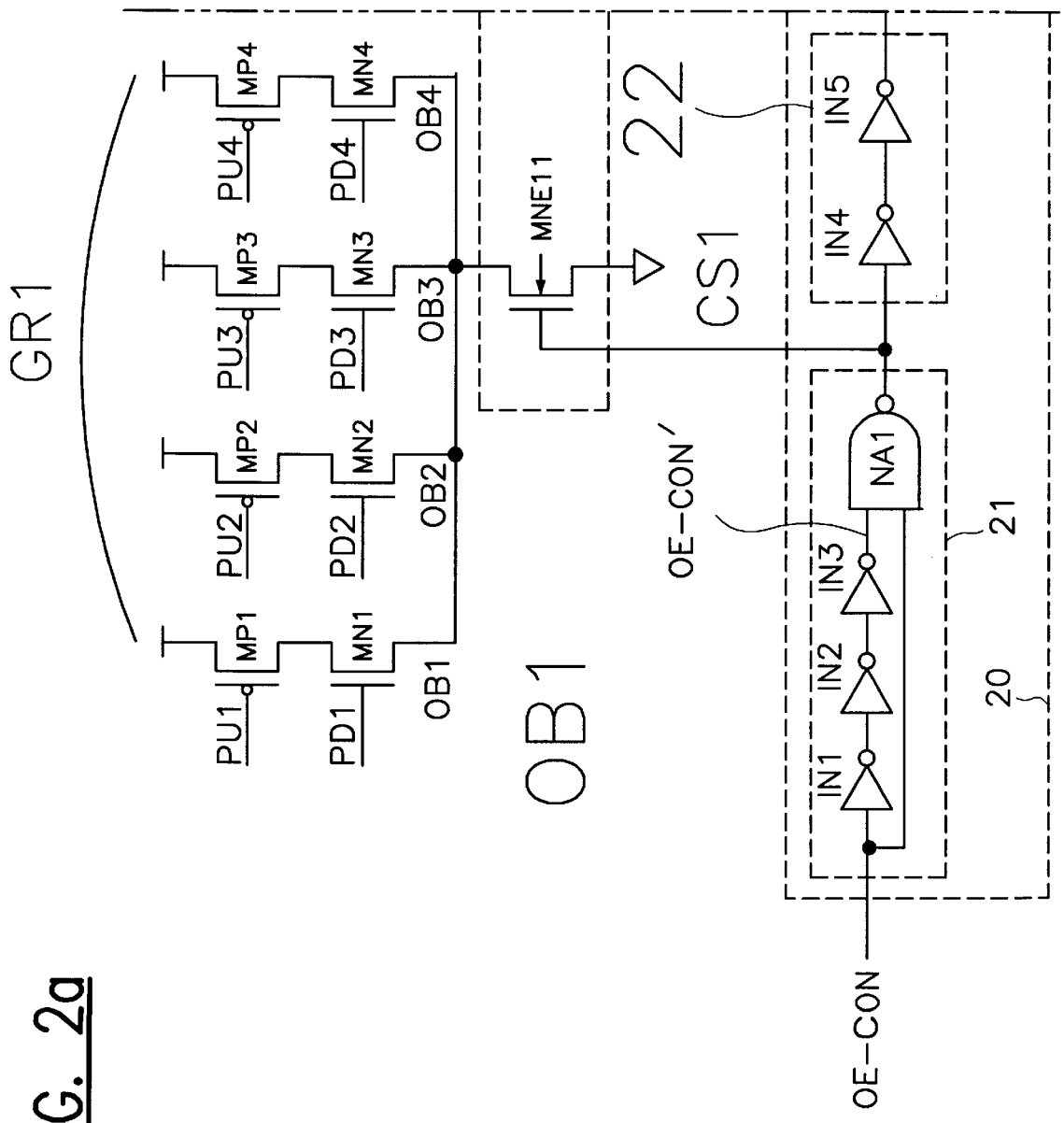
FIG. 2 is an output buffer circuit diagram of semiconductor memory devices according to an embodiment of the present invention.
Figure 2B:
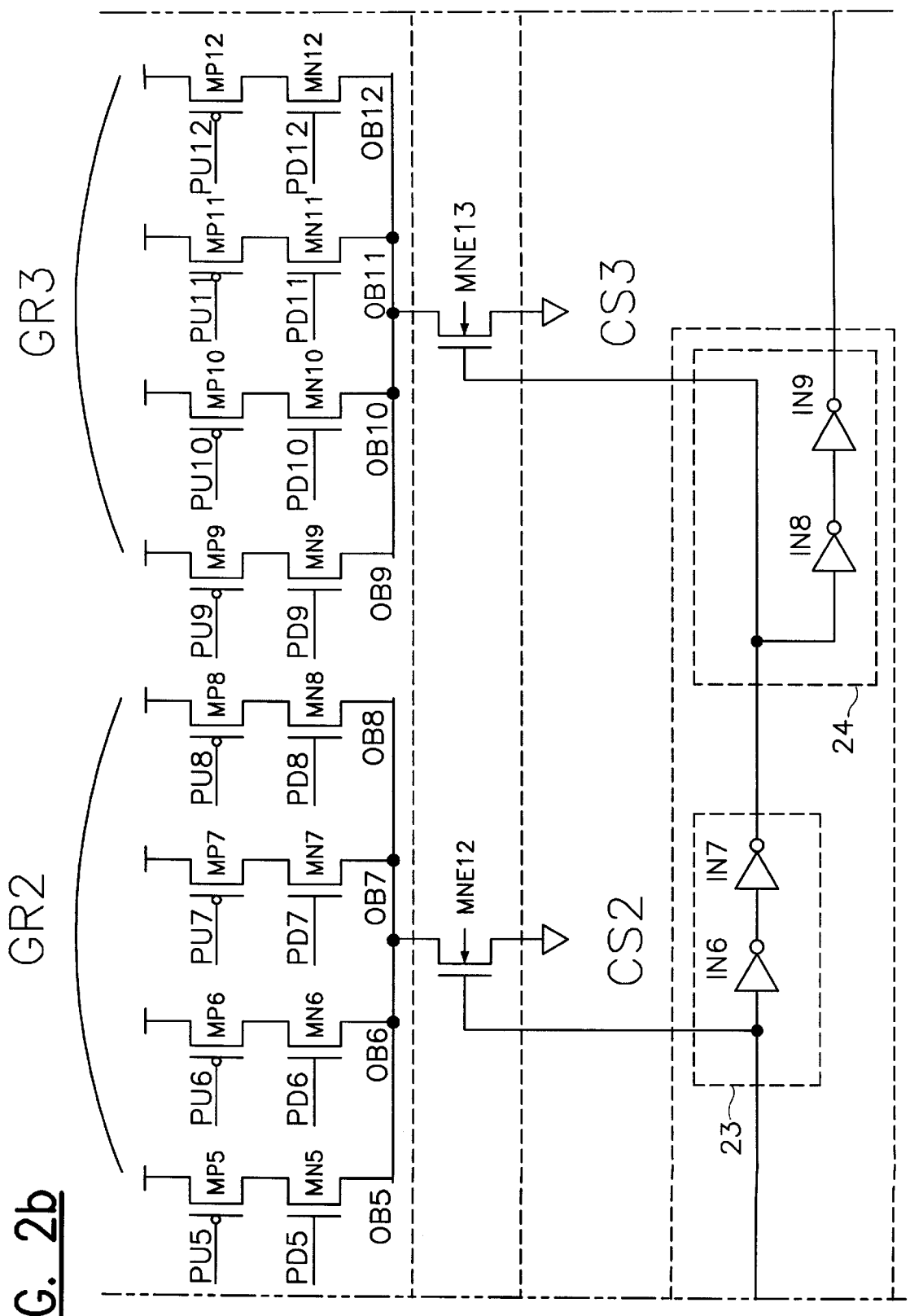

At col. 2, lines 40-41, please cancel "aplurality" and substitute --a plurality-- therefor;

at line 53, please cancel "FIG. 1 is" and substitute --Fig. 1 shows how Figs. 1a and 1b fit together. Figs. 1a and 1b together show--;

at line 55, please cancel "FIG. 2 is" and substitute --Fig. 2 shows how Figs. 2a, 2b, and 2c fit together. Figs. 2a, 2b, and 2c together show--;

at line 64, please cancel "FIG. 2 is" and substitute --Figs. 2a, 2b, and 2c together show-- therefor; and at lines 65-66, please cancel "FIG. 2" and substitute --Figs. 2a, 2b, and 2c-- therefor.

UNITED STATES PATENT AND TRADEMARK OFFICE
CERTIFICATE OF CORRECTION

PATENT NO : 5,929,669

DATED : July 27, 1999

INVENTOR(S): J. Kim

It is certified that error appears in the above-identified patent and that said Letters Patent is hereby corrected as shown below:

At col. 3, lines 2-3, please cancel "FIG. 1" and substitute --Figs. 1a and 1b--; and at line 63, please cancel "FIG. 3" and substitute --Figs. 3A-3E-- therefor.

At col. 4, line 18, please cancel "bluffer" and substitute --buffer-- therefor; and at line 23, please cancel "thethird controlsignal" and substitute --the third control signal-- therefor.

At col. 5, line 18 (claim 5, line 8), please cancel "internal first" and substitute --first internal-- therefor.

Signed and Sealed this

Second Day of May, 2000

Attest:

Q. TODD DICKINSON

Attesting Officer

Director of Patents and Trademarks